(12) United States Patent
Kwak

(10) Patent No.: US 6,869,848 B2
(45) Date of Patent: Mar. 22, 2005

(54) METHOD OF MANUFACTURING FLASH MEMORY DEVICE

(75) Inventor: Noh Yeal Kwak, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/727,470

(22) Filed: Dec. 4, 2003

(65) Prior Publication Data

US 2004/0248366 A1 Dec. 9, 2004

(30) Foreign Application Priority Data

Jun. 5, 2003 (KR) .............................. 10-2003-0036500

(51) Int. Cl.[7] .......................................... H01L 21/336
(52) U.S. Cl. ...................... 438/289; 438/259; 438/270; 438/268
(58) Field of Search ................................ 438/289, 259, 438/270, 268

(56) References Cited

U.S. PATENT DOCUMENTS

| 6,087,222 A | * | 7/2000 | Jung Lin et al. | ............ 438/259 |
| 6,124,608 A | * | 9/2000 | Liu et al. | .................... 257/315 |
| 2003/0094636 A1 | * | 5/2003 | Maeda | ........................ 257/288 |

* cited by examiner

Primary Examiner—Matthew Smith
Assistant Examiner—Victor V Yevsikov
(74) Attorney, Agent, or Firm—Marshall, Gerstein & Borun LLP

(57) ABSTRACT

A method of manufacturing a flash memory device, in which a spike annealing is performed after an ion implantation for controlling a threshold voltage. Therefore, it is possible to obtain a uniform and stabilized doping profile for controlling a threshold voltage, to use $BF_2$ ions as a dose for controlling a threshold voltage to obtain a shallow channel junction, to obtain different doping profiles in the channel junction depending on the process conditions and the atmosphere in the spike annealing equipment, and to control a doping profile for controlling a threshold voltage.

6 Claims, 2 Drawing Sheets

METHOD OF MANUFACTURING FLASH MEMORY DEVICE

BACKGROUND

1. Technical Field

Methods of manufacturing a flash memory devices are disclosed, and more particularly, a manufacturing method is disclosed that is capable of stabilizing a threshold voltage of a flash memory device which uses a high voltage.

2. Discussion of Related Art

Recently, for an implementation of a flash memory device, a self-aligned shallow trench isolation (SA-STI) has been adapted to form device isolation films to prevent damages on a tunnel oxide film and improve poor device characteristics. Meanwhile, for applying a high voltage to a well area and a junction area of the transistors which are formed according to the aforementioned method, the junction between a source and a drain has been formed as a double doped drain (DDD) junction instead of a pulse junction by using a plug implantation method. However, the number of the DDD junctions is inevitably limited to improve a breakdown voltage in preparation for application of a high voltage. In this case, the lowered ion concentration in the source area and the drain area makes an operating voltage of 1.0V or less which is normally used in a typical transistor appear to be relatively high. In addition, with a p-type dopant injected by the ion implantation to control a threshold voltage of a channel area, it is difficult to obtain an operating voltage less than 1.0V even by the implantation with a minimum quantity of ions. Typically, in order to improve a breakdown voltage, the ion implantation is performed with B11 ions instead of BF2 ions, which have a possibility of remnants in the junction area. However, even if the ion implantation is performed with boron B11, the boron may react in the subsequent heat treatments so that the injected dopant may be susceptible to a transient enhanced diffusion (TED).

SUMMARY OF THE DISCLOSURE

Methods of manufacturing a flash memory device are capable of obtaining a uniform and stabilized doping profile for controlling a threshold voltage.

One disclosed method comprises: performing an ion implantation for controlling a threshold voltage on a semiconductor substrate; performing a spike annealing for controlling a doping concentration and a doping profile of an implanted dopant; forming a device isolation film for isolating an active area and a field area on the semiconductor substrate; forming a gate electrode in which a tunnel oxide film, a floating gate electrode, a dielectric film, and a control gate electrode are deposited on the active area; and performing an ion implantation for forming junctions on the semiconductor substrate in both sides of the gate electrode to form a DDD junction structure.

In another embodiment, the ion implantation for controlling a threshold voltage is performed by using a p-type dopant with an ion implantation energy of 5 KeV to 50 KeV and a dose of 1E11 ion/cm$^2$ to 1E13 ion/cm.

In another embodiment, $BF_2$ is used as the p-type dopant.

In another embodiment, the spike annealing is performed under $NH_3$, $H_2$, or $N_2$ atmosphere at a temperature in the range of 900° C. to 1,100° C. with a heating rate of 100° C./sec to 250° C./sec.

BRIEF DESCRIPTION OF THE DRAWINGS

The aforementioned aspects and other features will be explained in the following description, taken in conjunction with the accompanying drawings, wherein.

DETAILED DESCRIPTION OF PRESENTLY PREFERRED EMBODIMENTS

Figure 1A:
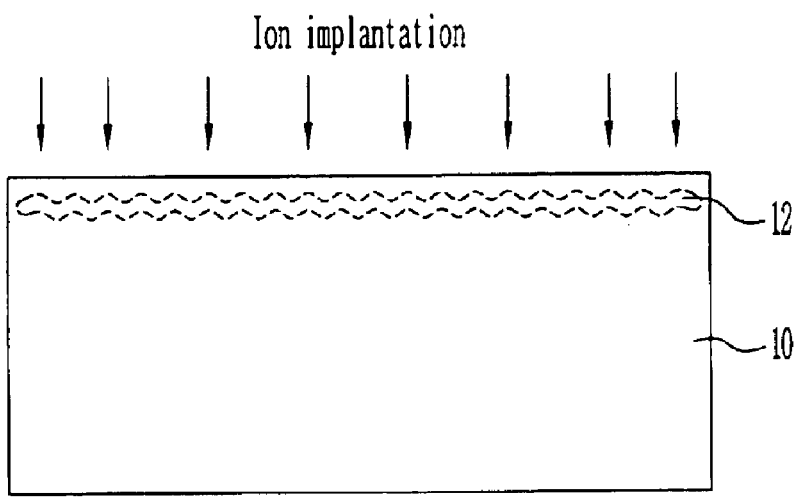
FIGS. 1A to 1D are cross-sectional views for explaining a disclosed method of manufacturing a flash memory device.

The disclosed methods will be described in detail by way of a preferred embodiment with reference to the accompanying drawings, in which like reference numerals are used to identify the same or similar parts.

According to an embodiment, the DDD junction is used as a junction for a high voltage NMOS in an X-decoder transistor or a cell transistor of an NAND flash device. This is because a high voltage is applied to a p-well area and a junction area of the aforementioned transistors. In order to increase a breakdown voltage in preparation for application of the high voltage, a post thermal treatment is performed by a $BF_2$ ion implantation and a spike annealing. This allows a flash memory device to be electrically stable due to decrease of concentration of the dopant remaining in the channel junction area.

FIGS. 1A to 1D are cross-sectional views for explaining a disclosed method of manufacturing a flash memory device.

Referring to FIG. 1A, an ion implantation is performed to adjust a threshold voltage of the device on a semiconductor substrate 10. A screen oxide (not shown) may be formed on the semiconductor substrate 10 to protect it before the ion implantation.

Specifically, in order to clean the semiconductor substrate 10 before the screen oxide is formed, a pre-cleaning process is performed by using a diluted HF (DHF) in which $H_2O$ and HF are mixed at a 50:1 rate and a standard cleaning −1 (SC-1) solution including $NH_4OH$, $H_2O_2$, and $H_2O$. Otherwise, it is possible to use a buffered oxide etchant (BOE) in which $NH_4F$ and HF are mixed at a rate of 100:1 to 300:1 and a SC-1 solution including $NH_4OH$, $H_2O_2$, and $H_2O$. Then, a wet or dry etching is performed at a temperature of 750° C. to 800° C. to form a screen oxide having a thickness of 30 to 120 Å. In this case, a p-type semiconductor substrate is used.

In order to control a threshold voltage, a p-type dopant is injected into a surface channel with an ion implanting energy of 5 KeV to 50 KeV and a dose of 1E11 ion/cm$^2$ to 1E13 ion/cm$^2$ to form an ion layer 12 for controlling a threshold voltage. Preferably, a dose of 5E12 to 5E13 ion/cm$^2$ is injected. Also, $49BF_2$ is used as the p-type dopant and the ion implantation is performed with a tilt of 3° to 13° to prevent channeling as much as possible. The aforementioned conditions for the ion implantation are not limited to the things that have been described but can be anything which can create junctions on the surface of the semiconductor substrate and does not cause any other leakage currents and generate leakage between the well area and the junction area. In addition, the ion implantation can be directly performed without any screen oxide.

Figure 1B:
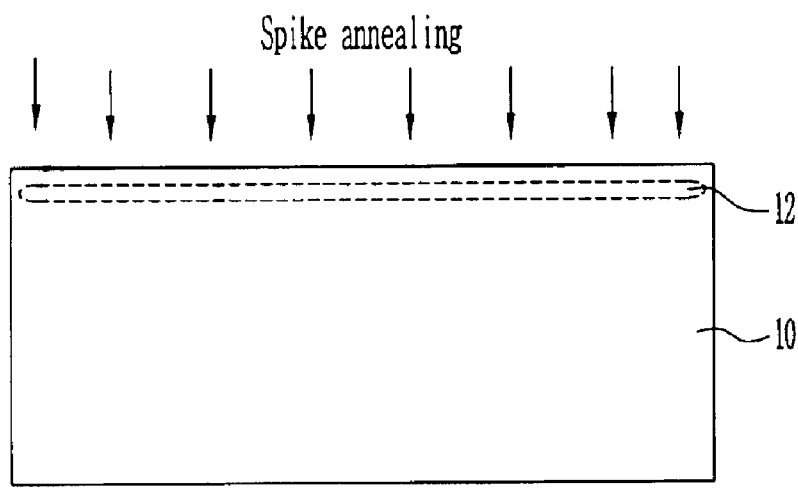
Figure 1C:
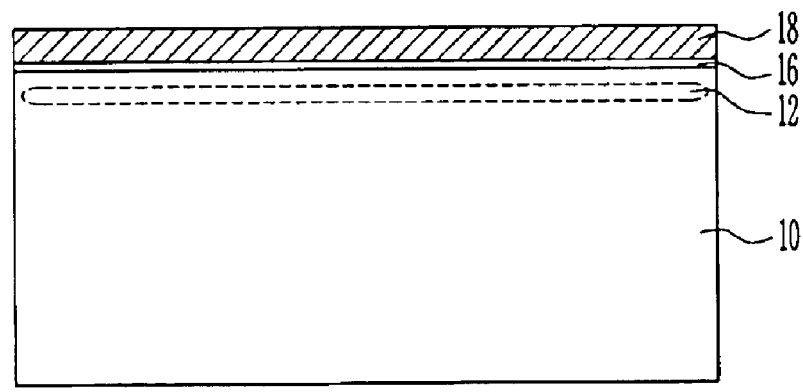

Referring to FIGS. 1B and 1C, the injected ions are stabilized by the spike annealing. Then, a tunnel oxide film 16 and a first poly-silicon film 18 are formed on the semiconductor substrate 10 in a sequential manner.

Specifically, an out-diffusion is performed for F19 ions injected with the p-type dopant by the spike annealing in $H_2$ or $N_2$ atmosphere. At the same time, an out-gassing of the dopant for controlling a threshold voltage is performed. Then, the spike annealing is performed at a temperature of 900° C. to 1,100° C. A ramp-up rate (heating rate) of the spike annealing is set to 100° C./sec to 250° C./sec. The spike annealing is performed in $N_2$ atmosphere in order to prevent growth of native oxides during the heat treatment of a high temperature and in $H_2$ or $NH_3$ atmosphere in order to improve an out-diffusion capability of the F19 ion. While the out-gassing of the fluorine ions (F19) is performed, the out-gassing of the boron ions (B) injected together with the F19 is also performed.

Figure 2:
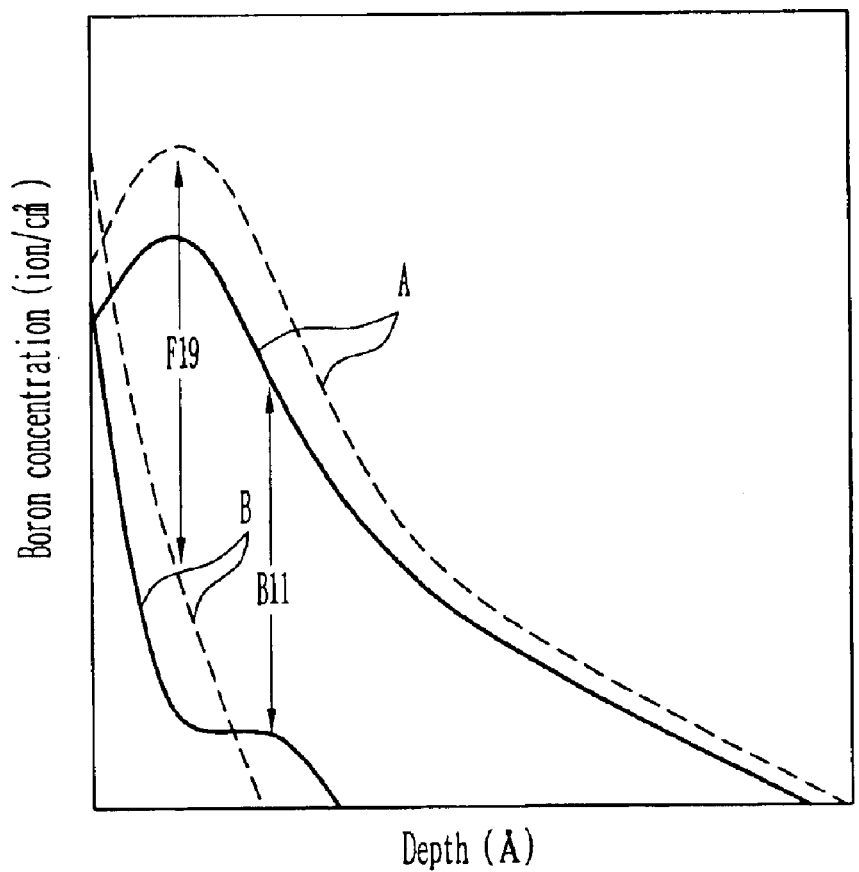
FIG. 2 is a graph showing changes of concentrations of boron ions and fluorine ions as a result of the spike annealing.

FIG. 2 is a graph showing changes of concentrations of the boron ions and the fluorine ions caused by the spike annealing.

A dotted line in FIG. 2 corresponds to changes of concentration of the fluorine ions, and a solid line in FIG. 2 corresponds to changes of concentration of the boron ions. Also, the lines (A) show changes of concentration of $BF_2$ ions injected to control a threshold voltage depending on depth, and the lines (B) show changes of concentrations of the boron ions and fluorine ions after the spike annealing depending on depth. As shown in FIG. 2, once the spike annealing is performed after the ion implantation for controlling a threshold voltage, the out-gassing is performed for the boron ions as well as the fluorine ions as described above so that a boron ion layer can be formed on a substrate with a low concentration.

By the aforementioned spike annealing using the $BF_2$ ions, it is possible to obtain a uniform profile of the dopant for controlling a threshold voltage, which is difficult to obtain by the ion implantation with a minimum dose. In other words, the ion implantation for controlling a threshold voltage can be performed with the $BF_2$ ions, which have not been used in the conventional method due to degradation of film quality caused by the F19. For this reason, it is possible to obtain the operating voltage less than 1.0V. In addition, it is possible to obtain a doping profile for controlling a threshold voltage with a steep incline, thereby preventing degradation of the oxide film quality caused by a haul effect in an NAND flash device, which utilizes FN tunneling. Also, it is possible to obtain a uniform doping profile and to control and stabilize a threshold voltage because the concentration of the remaining B11 dose, which has been injected into the channel junction area, is decreased due to the out-gassing of F19 during the spike annealing. It is possible to obtain different doping results in the channel junction area and to control the doping profile for controlling a threshold voltage depending on the atmosphere in the spike annealing equipment and the process conditions such as an annealing temperature, a heating rate, gases, and a processing time. Furthermore, the implanted dopant can be thermally stabilized by the spike annealing.

After the out-gassing by the spike annealing, a tunnel oxide film 16 is formed by an oxidation process. The oxidation process is performed by a wet oxidation at a temperature in the range of 750 to 800° C. and an annealing is performed by using $N_2$ at a temperature of 900 to 910° C. for a period of 20 to 30 minutes. A chemical vapor deposition (CVD), a low pressure CVD (LP-CVD), a plasma enhanced CVD (PE-CVD), or an atmospheric pressure CVD (AP-CVD) is performed at a temperature of 580° C. to 620° C. with a pressure of 0.1 torr to 3.0 torr to deposit a poly-silicon film 18 on the tunnel oxide film 16. The first poly-silicon film 18 is an amorphous silicon film having a thickness of 250 to 500 Å doped by $SiH_4$ or $Si_2H_6$ and $PH_3$ gases with a p-type material having a concentration of approximately 1.5E20 atoms/cc to 3.0E20 atoms/cc. As a result, a particle size of the first poly-silicon film 18 is minimized to prevent an electric field convergence. The first poly-silicon film 18 acts as a buffer layer during the device isolation films are formed and as a part of the floating gate to be formed by the subsequent processes.

Figure 1D:
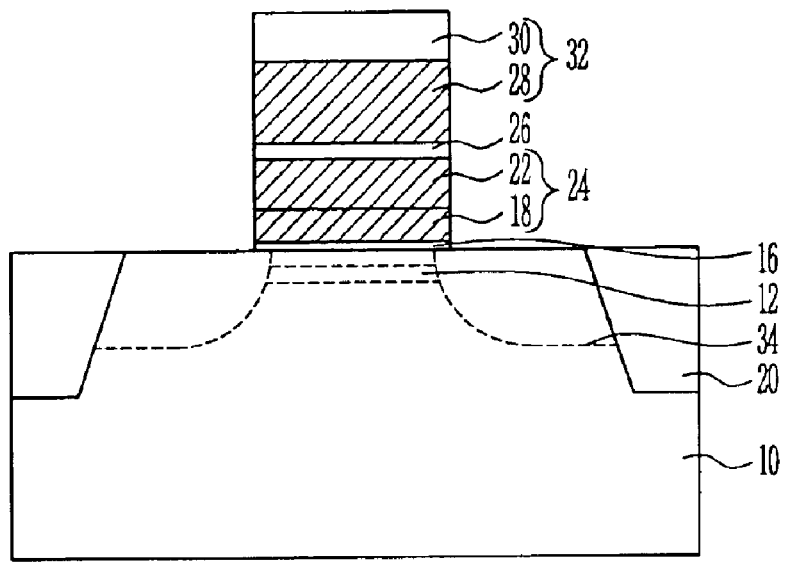

Referring to FIG. 1D, device isolation films 20 are formed by a patterning process, and then a second poly-silicon film 22 is deposited. A floating gate electrode 24 is formed by a planarizing process or a patterning process. A dielectric film 26 is formed along with the steps on a top surface of a whole semiconductor structure, and a film for a control gate electrode is deposited thereon. Then, a control gate electrode 32 is formed by a patterning process and a junction area 34 is formed by an ion implantation.

Specifically, a pad nitride film (not shown) is deposited on the first poly-silicon film 18 and an SA-STI process is applied to form trenches of a STI structure (not shown) on the semiconductor substrate 10 so that the semiconductor substrate 10 is divided into an active area in which devices are to be formed and a field area by which the devices are isolated. The trenches of the STI structure are buried with a high-density plasma (HDP) oxide film and then the first poly-silicon film 18 is exposed by a planarizing process and a nitride film strip process. On a top surface of the whole structure, a second poly-silicon film 22 is deposited and then a patterning process or a planarizing process is performed to form a floating gate electrode 24 including the first and second poly-silicon films 18 and 22. The second poly-silicon film 22 is formed by depositing a silicon film made of the same material as the first poly-silicon film 18 to have a thickness of 400 to 1,000 Å. In addition, the pad nitride film is formed by the LP-CVD method to have a thickness of 900 to 2,000 Å.

On a top surface of the whole structure, a dielectric film 26 including a first oxide film, a nitride film, and a second oxide film is deposited along with the step thereon so as to constitute an ONO structure ($SiO_2$—$Si_3N_4$—$SiO_2$). In the deposition of the dielectric film 26 having an ONO structure, the first and second oxide films (not shown) are formed by depositing a hot temperature oxide where dichloro silane (DCS; $SiH_2Cl_2$) and $N_2O$ gases are used for a source due to its high dielectric voltage level and an excellent time dependent dielectric breakdown (TDDB) characteristics. In addition, the nitride film (not shown) between the first oxide film and the second oxide film is deposited by a CVD, a PE-CVD, an LP-CVD, or an AP-CVD of which process conditions can bring about a good step coverage where the DCS and $NH_3$ gases are used in a low pressure of 1 to 3 torr at a temperature of 650 to 800° C. As a result of the aforementioned deposition processes, the first oxide film is grown to a thickness of 35 to 100 Å, the nitride film is grown to a thickness of 50 to 100 Å, and the second oxide film is grown to a thickness of 35 to 150 Å. In order to improve film quality of the ONO structure and reinforce the interfaces between respective layers after the ONO process, a steam annealing may be performed to oxidize it to a thickness of 150 to 300 Å based on a monitoring wafer by a wet oxidation method at a temperature of 750 to 800° C. Furthermore, during the ONO process and the steam annealing, each process may be performed without any delay or within very short delay, thereby preventing growth of native oxides and contamination by pollutants.

The film for a control gate electrode includes a third poly-silicon film 28 and a tungsten silicide film 30.

Preferably, a deposition of the third poly-silicon film 28 is performed by a CVD, a PE-CVD, an LP-CVD, or an AP-CVD to form an amorphous silicon film at a temperature of 510 to 550° C. under a pressure of 1.0 to 3.0 torr and to form a dual film structure having a doped film and an undoped film in order to prevent diffusion of the fluoric acid which is probably substituted into the dielectric film 26 and raises a thickness of the oxide film and creation of $WP_x$ layer formed by the bonds between tungsten (W) and phosphorous (P). As a result, it is possible to prevent blowing-up phenomena of a tungsten silicide film 30 which will be formed thereon. A proportion between the doped film and the undoped film is set to 1:2 to 6:1, and an amorphous silicon film having a thickness of 500 to 1,500 Å is formed to bury the space between the second poly-silicon films 22, whereby it is possible to prevent a gap formation when a tungsten silicide film 30 is deposited and reduce a resistance of the word line. Also, in order to form the third poly-silicon film 28 having a dual film structure, it is preferable that $SiH_4$ or $Si_2H_6$ and $PH_3$ gases are used for forming the doped film, the $PH_3$ gas is cut off, and then the undoped film is formed in a sequential manner. Advantageously, the tungsten silicide film 30 is formed to have a proper step coverage at a temperature of 300 to 500° C. by the reaction of $WF_6$ and DCS ($SiH_2CL_2$) or MS ($SiH_4$) which contains a small quantity of fluorine and has a low post annealed stress and a high bonding stress, and the film is grown with a stoichiometric ratio of 2.0 to 2.8 which corresponds to the number capable of minimizing the word line resistance Rs. An ARC layer (not shown) is deposited on the tungsten silicide film 30 by using $SiO_xN_y$ or $Si_3N_4$. Then, an etching process with a gate mask and another etching process with a self-aligned mask are performed to form a control gate electrode 32. The source/drain junction area is formed as a DDD junction in order to improve a breakdown voltage in preparation for application of a high voltage to constitute a flash memory device. Such a DDD junction requires a lower positive type doping level in its channel junction area.

As described above, it is possible to obtain a uniform doping profile for controlling a threshold voltage and stabilize it by the spike annealing after the ion implantation for controlling a threshold voltage.

In addition, it is possible to use $BF_2$ ions as a dose for controlling a threshold voltage, thereby obtaining a shallow channel junction.

In addition, it is possible to obtain different doping results in the channel junction and to control the doping profile for controlling a threshold voltage depending on the process conditions and the atmosphere in the spike annealing equipment.

Although the foregoing description has been made with reference to the preferred embodiments, it is to be understood that changes and modifications to the disclosed methods may be made by the ordinary skilled in the art without departing from the spirit and scope of this disclosure and the appended claims.

What is claimed is:

1. A method of manufacturing a flash memory device, comprising:

performing an ion implantation for controlling a threshold voltage on a semiconductor substrate;

performing a spike annealing for controlling a doping concentration and a doping profile of an implanted dopant, wherein the spike annealing is performed under $NH_3$, $H_2$, or $N_2$ atmosphere at a temperature in the range of 900° C. to 1,100° C. with a heating rate of 100° C./sec to 250° C./sec;

forming a device isolation film for isolating an active area and a field area on the semiconductor substrate;

forming a gate electrode in which a tunnel oxide film, a floating gate electrode, a dielectric film, and a control gate electrode are deposited on the active area; and performing an ion implantation for forming junctions on the semiconductor substrate in both sides of the gate electrode to form a DDD junction structure.

2. The method of manufacturing a flash memory device according to claim 1, wherein the ion implantation for controlling a threshold voltage is performed by using a p-type dopant with an ion implantation energy of 5 KeV to 50 KeV and a dose of 1E11 ion/$cm^2$ to 1E13 ion/$cm^2$.

3. The method of manufacturing a flash memory device according to claim 2, wherein $BF_2$ is used as the p-type dopant.

4. A method of manufacturing a flash memory device, comprising:

performing an ion implantation for controlling a threshold voltage on a semiconductor substrate;

performing a spike annealing for controlling a doping concentration and a doping profile of an implanted dopant, wherein the spike annealing is performed under $NH_3$, $H_2$, or $N_2$ atmosphere;

forming a device isolation film for isolating an active area and a field area on the semiconductor substrate;

forming a gate electrode in which a tunnel oxide film, a floating gate electrode, a dielectric film, and a control gate electrode are deposited on the active area; and performing an ion implantation for forming junctions on the semiconductor substrate in both sides of the gate electrode to form a DDD junction structure.

5. The method of manufacturing a flash memory device according to claim 4, wherein the ion implantation for controlling a threshold voltage is performed by using a p-type dopant with an ion implantation energy of 5 KeV to 50 KeV and a dose of 1E11 ion/$cm^2$ to 1E13 ion/$cm^2$.

6. The method of manufacturing a flash memory device according to claim 5, wherein $BF_2$ is used as the p-type dopant.

* * * * *

UNITED STATES PATENT AND TRADEMARK OFFICE
CERTIFICATE OF CORRECTION

PATENT NO. : 6,869,848 B2  Page 1 of 1
DATED : March 22, 2005
INVENTOR(S) : Noh Yeal Kwak It is certified that error appears in the above-identified patent and that said Letters Patent is hereby corrected as shown below:

Title page,
Item [75], Inventors, after "Noh Yeal Kwak," please delete "Ichon-Shi" and insert -- Kyungki-Do -- in its place.
Item [73], Assignee, after "Hynix Semiconductor Inc.," please delete "Ichon-Shi" and insert -- Kyungki-do -- in its place.

Signed and Sealed this

Twenty-third Day of August, 2005

JON W. DUDAS
*Director of the United States Patent and Trademark Office*